(12) United States Patent
Lusk et al.

(10) Patent No.: US 8,078,659 B2
(45) Date of Patent: Dec. 13, 2011

(54) REDUCTION OF DIGITAL FILTER DELAY

(75) Inventors: Dan Lusk, Huskvarna (SE); Tonu Trump, Stockholm (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 897 days.

(21) Appl. No.: 12/092,013

(22) PCT Filed: Oct. 31, 2006

(86) PCT No.: PCT/SE2006/001233
§ 371 (c)(1), (2), (4) Date: Apr. 29, 2008

(87) PCT Pub. No.: WO2007/053086
PCT Pub. Date: May 10, 2007

(65) Prior Publication Data
US 2008/0256160 A1 Oct. 16, 2008

(30) Foreign Application Priority Data
Oct. 31, 2005 (SE) ........................ 0502415

(51) Int. Cl.
*G06F 17/10* (2006.01)
(52) U.S. Cl. ........................................... 708/300
(58) Field of Classification Search ............... None
See application file for complete search history.

(56) References Cited

U.S. PATENT DOCUMENTS

| | | | |
|---|---|---|---|
| 7,774,396 B2* | 8/2010 | Dickson et al. | 708/322 |
| 2002/0184010 A1* | 12/2002 | Eriksson et al. | 704/219 |
| 2007/0118367 A1* | 5/2007 | Dickson et al. | 704/221 |
| 2009/0017784 A1* | 1/2009 | Dickson et al. | 455/296 |
| 2010/0198899 A1* | 8/2010 | Dickson et al. | 708/322 |

* cited by examiner

*Primary Examiner* — David H Malzahn

(57) ABSTRACT

An apparatus for reducing a digital filter delay includes means for determining the magnitude response of a desired filter. Means form the real cepstrum of this magnitude response. Means transform the real cepstrum into a complex cepstrum of a corresponding minimum-phase filter having the same magnitude response as the desired filter. A filter applies a smoothly decaying shaping window to the complex cepstrum. Means transform the shaped complex cepstrum into an estimated minimum-phase filter.

10 Claims, 7 Drawing Sheets

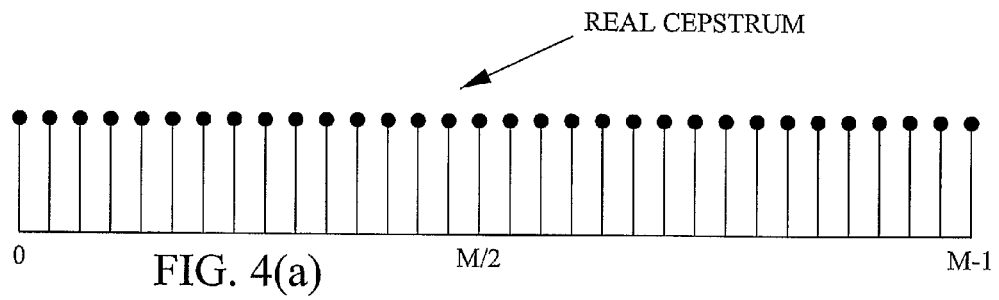
FIG. 4(a) REAL CEPSTRUM
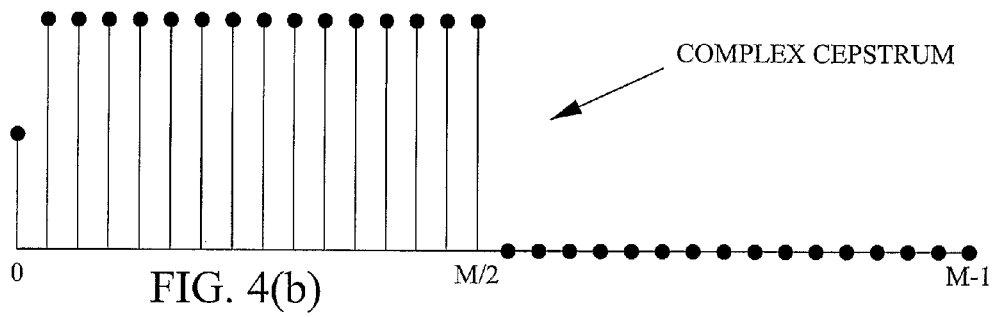
FIG. 4(b) COMPLEX CEPSTRUM
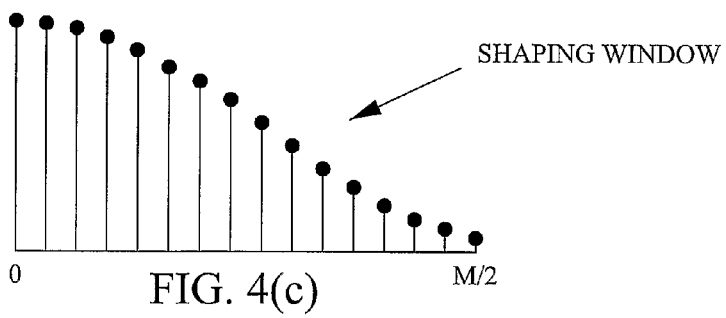
FIG. 4(c) SHAPING WINDOW
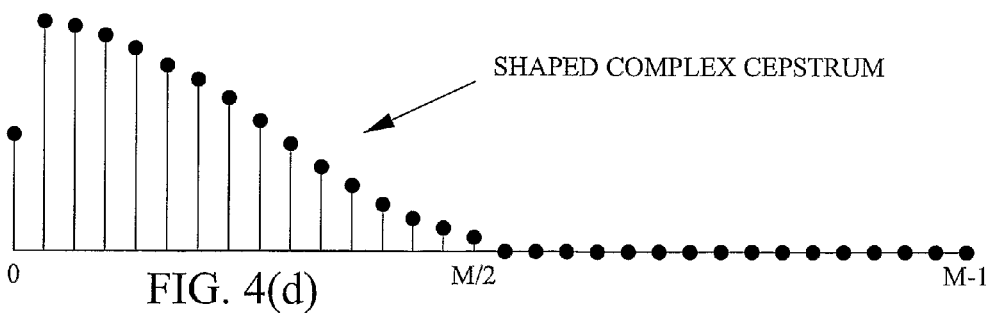
FIG. 4(d) SHAPED COMPLEX CEPSTRUM

REDUCTION OF DIGITAL FILTER DELAY

TECHNICAL FIELD

The present invention relates to reduction of delay in digital filters based on a desired magnitude response.

BACKGROUND

Requirements on a digital signal processing device to be used in a telephony network normally aim at minimizing the signal propagation delay imposed by the device, to reduce the total round trip delay which otherwise would affect the conversation quality negatively, see [1]. It is common for signal processing devices (such as noise reduction devices, echo cancellers, etc.) to apply some kind of linear filtering, serially connected to the signal path, to improve the speech signal. Two examples are:
1. Noise reduction devices, where the common solution is to apply filtering so that the disturbing background noise is reduced while at the same time retaining the speech so as to improve intelligibility.
2. Echo cancellation devices, where typically a linear adaptive filter (connected in parallel with the echo path) models the echo path to enable subtraction of a replica of the echo and thus a reduction of the echo level. However, due to imperfections in the adaptive algorithms and due to time varying and possibly non-linear echo paths, residual echo is left after the subtraction. This residual echo is typically removed by a non-linear processor (NLP), which detects the presence of the residual echo and, if found, removes it (optionally replacing it with some kind of generated comfort noise). The NLP is usually implemented as a switch that either passes or suppresses the signal applied to it. However, the NLP may also be implemented as a serially connected linear filter, as described in [2].

In both these telecommunication applications it is vital that the voice enhancement devices do not add to the round trip delay. Thus, it is desirable to minimize the delay of the signal processing filters. However, at the same time it is also desirable to maintain high stop-band rejection. Achieving high stop-band rejection is particularly important in echo cancellation applications, where a serially connected filter is required to suppress residual echo in certain frequency bands (the ones where residual echo dominates over true near end signal), while passing some other bands (the ones dominated by the true near end signal).

The derivative of the phase characteristic of a linear filter with respect to frequency is a measure of the time delay (i.e. group delay or envelope delay) that signal frequency components undergo in passing through the filter. A minimum-phase filter characteristic implies a minimum delay function, while a maximum-phase filter characteristic implies that the delay characteristic is also maximum. A mixed-phase system has a delay in between the two extremes. One solution to decrease the delay, which is imposed by a linear filter, is to convert it to a minimum-phase filter, which by definition has a minimal group delay through the filter.

Suppose that we have a finite impulse response (FIR) filter prototype $H(\omega)$ with real coefficients. The magnitude square value of its frequency response is $$|H(\omega)|^2 = H(z) H^*\left(\frac{1}{z^*}\right)\bigg|_{z=e^{j\omega}} \quad (1)$$

Relationship (1) implies that if we replace a zero $z_k$ of the filter by its inverse $1/z_k$ inside the unit circle, the magnitude characteristic of the filter does not change. Hence, a method for converting a finite impulse response (FIR) mixed/maximum phase filter to a minimum-phase filter is to mirror all zeros into the unit circle. However, this requires that the exact values of the zeros $z_k$ need to be calculated and would also require a large amount of divisions, which is inefficient in a typical real-time application on a digital signal processor (DSP). Mainly three workable other approaches exist for performing the conversion to a minimum-phase filter:
A. Spectral factorisation, e.g. using some approximating recursive algorithms as described in [3, 4]. However, a problem with spectral factorisation is that it is computationally demanding and that it needs an increasing number of iterations to reliably form a minimum-phase filter of a demanding filter prototype (i.e. a complicated desired magnitude response with high dynamic range) with high required stop band attenuation.
B. Employing homomorphic filtering as described in, for example, [5]. The method essentially determines the real cepstrum of the magnitude response of the desired digital filter, transforms this into a corresponding complex cepstrum representing a minimum-phase filter, and determines the minimum-phase digital filter corresponding to the complex cepstrum. The problem with this method is that it requires long discrete Fourier transforms (DFTs) to attain high stop band rejection in the resulting minimum-phase filter and thus becomes computationally demanding.
C. The errors imposed due to the usage of a discrete Fourier transform (DFT) in method B have been analysed in [6], and a method is proposed to reduce these errors. The method basically trusts on the usage of long DFTs together with truncation of the resulting impulse responses to minimise the effects of aliasing. This results in that the effective length of the impulse response will be half of the length of the used DFT. When using short DFTs, this leads to difficulties in obtaining the desired magnitude response of the prototype filter.

SUMMARY

An objective of the present invention is to provide a method and apparatus for reducing the delay of a desired filter with a given magnitude response to approximately minimum-phase with shorter DFTs than in the prior art.

Another objective is an echo canceller including such an apparatus.

Still another objective is a noise suppressor including such an apparatus.

These objectives are achieved in accordance with the attached claims.

Briefly, the present invention is based on method B above, but shapes the coefficients to be included in the complex cepstrum corresponding to the minimum-phase filter by applying a smoothly decaying window function. This makes it possible to obtain estimates of minimum-phase filters from demanding magnitude responses by using short DFTs. The use of short DFTs results in a low complexity solution compared to the prior art solutions, without sacrificing the requirements on high stop band rejection.

BRIEF DESCRIPTION OF THE DRAWINGS

The invention, together with further objects and advantages thereof, may best be understood by making reference to the following description taken together with the accompanying drawings, in which:

FIG. 4(*a*)-(*d*) is a sequence of diagrams graphically illustrating the embodiment of FIG. 3;

DETAILED DESCRIPTION

To better explain how the idea of the present invention is related to minimum-phase filter design, let us first reproduce some of the theory.

Suppose we have a finite impulse response (FIR) filter $$h(n), 0 \leq n \leq N \tag{2}$$

The system function of the filter h is given by its z-transform $$H(z) = \sum_{n=0}^{N} h(n) z^{-n} \tag{3}$$

Denote the logarithm of the magnitude response of the system function above as $$\hat{H}(z) = \ln(|H(z)|) \tag{4}$$

The cepstrum, or more accurately the real cepstrum, of h is defined as the coefficients $\hat{h}(n)$ of the power series expansion of $\hat{H}(z)$, i.e.

$$\hat{H}(z) = \sum_{n=-\infty}^{\infty} \hat{h}(n) z^{-n} \tag{5}$$

given that the series is convergent. The coefficients of the power series expansion above, i.e. the real cepstrum, can be computed using the inverse z-transform of $\hat{H}(z)$ $$\hat{h}(n) = \frac{1}{2\pi j} \oint_C \hat{H}(z) z^{n-1} dz \tag{6}$$

or explicitly $$\hat{h}(n) = \frac{1}{2\pi j} \oint_C \ln(|H(z)|) z^{n-1} dz \tag{7}$$

Choosing the integration contour, C, to be the unit circle, (6) transforms to $$\hat{h}(n) = \frac{1}{2\pi} \int_{-\pi}^{\pi} \hat{H}(e^{j\omega}) e^{j\omega n} d\omega \tag{8}$$

Figure 1:
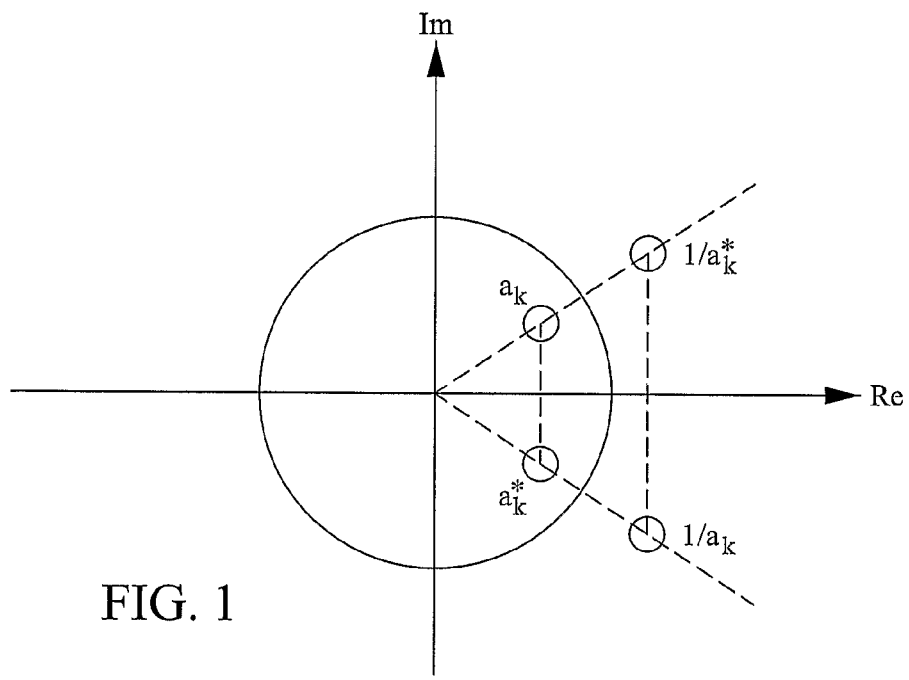
FIG. 1 is a diagram illustrating the location of zeros of the magnitude response of a FIR filter.

Denote the zeros of H(z) by $a_k$. Now, it is well known that the zeros of $$|H(z)|^2 = H(z) H^*\left(\frac{1}{z^*}\right) = A^2 \prod_{k=1}^{K} (1 - a_k z^{-1})(1 - a_k^* z) \tag{9}$$

are located in conjugate reciprocal pairs, as illustrated in FIG. 1. Denote the zeros of H(z) that lie inside the unit circle by $c_k$ and the zeros that lie outside the unit circle by $b_k$. Then (9) can be rewritten as $$|H(z)|^2 = A^2 \prod_{k=1}^{K} (1 - c_k z^{-1}) \prod_{k=1}^{K} (1 - b_k z) \tag{10}$$

Computing the logarithm of the square root of the above expression results in $$\hat{H}(z) = \ln A + \frac{1}{2} \sum_{k=1}^{K} \ln(1 - c_k z^{-1}) + \frac{1}{2} \sum_{k=1}^{K} \ln(1 - b_k z) \tag{11}$$

Using the following power series representations $$\ln(1 - \alpha z^{-1}) = -\sum_{n=1}^{\infty} \frac{\alpha^n}{n} z^{-n}, |z| > |\alpha| \tag{12}$$

$$\ln(1 - \beta z) = -\sum_{n=1}^{\infty} \frac{\beta^n}{n} z^n, |z| < |\beta^{-1}|$$

gives $$\hat{H}(z) = \ln A - \sum_{n=1}^{\infty} \frac{1}{2n} \sum_{k=1}^{K} c_k^n z^{-n} - \sum_{n=1}^{\infty} \frac{1}{2n} \sum_{k=1}^{K} b_k^n z^n \tag{13}$$

Comparing the above with (5) and identifying coefficients of the same power of z it is evident that $$\hat{h}(n) = \begin{cases} -\frac{1}{2n} \sum_{k=1}^{K} c_k^n, & n > 0 \\ \ln A, & n = 0 \\ \frac{1}{2n} \sum_{k=1}^{K} b_k^{-n}, & n < 0 \end{cases} \tag{14}$$

From (14) it may be noted that the components originating from the zeros inside the unit circle only contribute to the cepstrum at positive n and that the components originating from zeros outside the unit circle only contribute to the cepstrum at negative n. A minimum-phase filter has all its zeros inside the unit circle. Hence, to get the cepstrum corresponding to a minimum-phase filter one needs to set the cepstrum at negative n to zero.

Furthermore, from (14) it may also be noted that the real cepstrum has infinite duration although the original filter h(n) has a finite length.

A similar reasoning as above can be applied to the complex cepstrum (see [5]), i.e.

$$\hat{h}_{CPLX}(n) = \frac{1}{2\pi j}\oint_C \ln(H(z))z^{n-1}dz \qquad (15)$$

where it is noted that the magnitude ("| |") taken in (7) has been removed. In the special case of a minimum-phase filter this leads to the following representation of the complex cepstrum $$\hat{h}_{min}(n) = \begin{cases} -\frac{1}{n}\sum_{k=1}^{K} c_k^n, & n > 0 \\ \ln A, & n = 0 \\ 0 & n < 0 \end{cases} \qquad (16)$$

Comparing (16) with (14), it is evident that the complex cepstrum of a minimum-phase sequence can be restored from its real cepstrum as $$\hat{h}_{min}(n) = \begin{cases} 2\cdot \hat{h}(n), & n > 0 \\ \hat{h}_{min}(n), & n = 0 \\ 0 & n < 0 \end{cases} \qquad (17)$$

In order to obtain the impulse response of the minimum-phase filter one needs to reverse the process, i.e. compute $$\hat{H}_{min}(z) = \sum_{n=-\infty}^{\infty} \hat{h}_{min}(n)z^{-n} \qquad (18)$$

$$H_{min}(z) = \exp\{\hat{H}_{min}(z)\} \qquad (19)$$

$$h_{min}(n) = \frac{1}{2\pi}\int_{-\pi}^{\pi} H_{min}(e^{j\omega})e^{j\omega n}\,d\omega \qquad (20)$$

Figure 2:
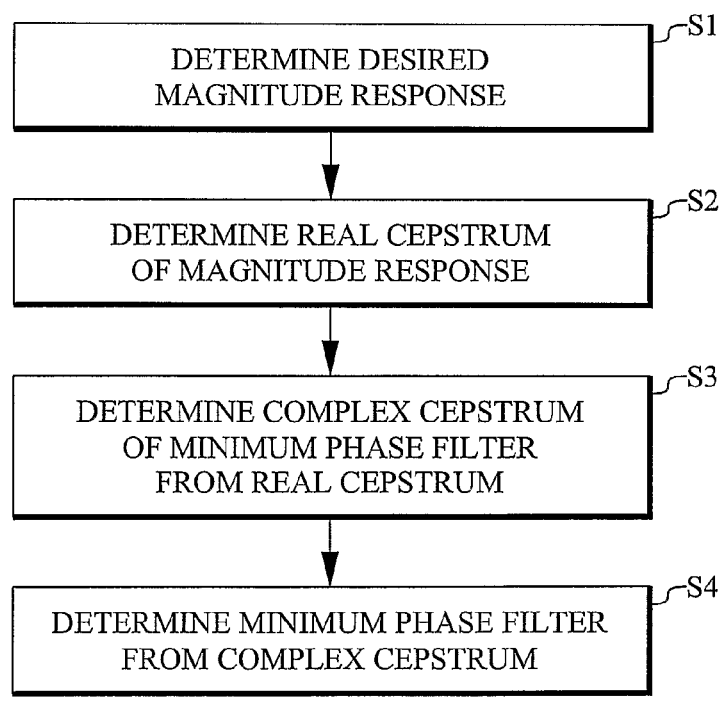
FIG. 2 is a flow chart illustrating a prior art method for obtaining an estimate of a minimum-phase filter from a desired magnitude response.

The outlined method may be implemented by using the discrete Fourier transform (DFT) and its inverse (IDFT), as described in [5] and illustrated in FIG. 2. The discrete transforms are typically implemented by the fast and inverse fast Fourier transform (FFT and IFFT) of length M. Step S1 determines the magnitude response $|H(\omega_k)|$ of a desired filter. Step S2 determines the real cepstrum corresponding to this magnitude response in accordance with $$\hat{H}(\omega_k) = \ln(|H(\omega_k)|), k=0, 1, \ldots, M-1 \qquad (21)$$

$$\hat{h}(n) = IDFT(\hat{H}(\omega_k)), n=0, 1, \ldots, M-1 \qquad (22)$$

Here M must be sufficiently large to avoid aliasing (M=1024 in the example given in [5]). Step S3 determines the complex cepstrum of the desired minimum-phase filter from the real cepstrum in accordance with $$\hat{h}_{min}(n) = \begin{cases} 2\cdot \hat{h}(n), & n = 1, 2, \ldots, M/2 \\ \hat{h}(n), & n = 0 \\ 0 & n = M/2+1, \ldots, M-1 \end{cases} \qquad (23)$$

Note that due to the periodicity assumed by the IDFT, the cepstral components with negative n are (by convention) located between M/2+1 and M−1 in equation (23). Finally step S4 determines the frequency response $H_{min}(\omega_k)$ of the minimum-phase filter from this complex cepstrum in accordance with $$H_{min}(\omega_k) = \exp\{DFT(\hat{h}_{min}(n))_k\}, k=0, 1, \ldots, M-1 \qquad (24)$$

The resulting filter $h_{min}(n)$ is causal and gives an estimate of a minimum-phase filter, where the quality of the estimate depends on e.g. the involved FFT lengths.

When computing the minimum-phase impulse response, a problem arises in practice due to the fact that it is necessary to replace the infinite coefficient sequence $\hat{h}_{min}(n)$ with a finite sequence. This operation implies a truncation, which introduces errors in the computations. The prior art method B suggests that the problem can be relieved by selecting a long enough DFT. However, as mentioned earlier, using long DFTs results in high computational complexity. The present invention takes another approach by noting that when truncating a function before computing its DFT, the resulting spectrum will be a convolution between the spectrum of interest and the spectrum of the window function used for truncation (Gibbs's phenomenon). According to the present invention, truncation of the cepstrum is done by shaping the cepstrum with a shorter, smoothly decaying (in n, which is called "quefrency" in cepstrum analysis) window function instead of abruptly truncating it with a longer rectangular window.

Figure 3:
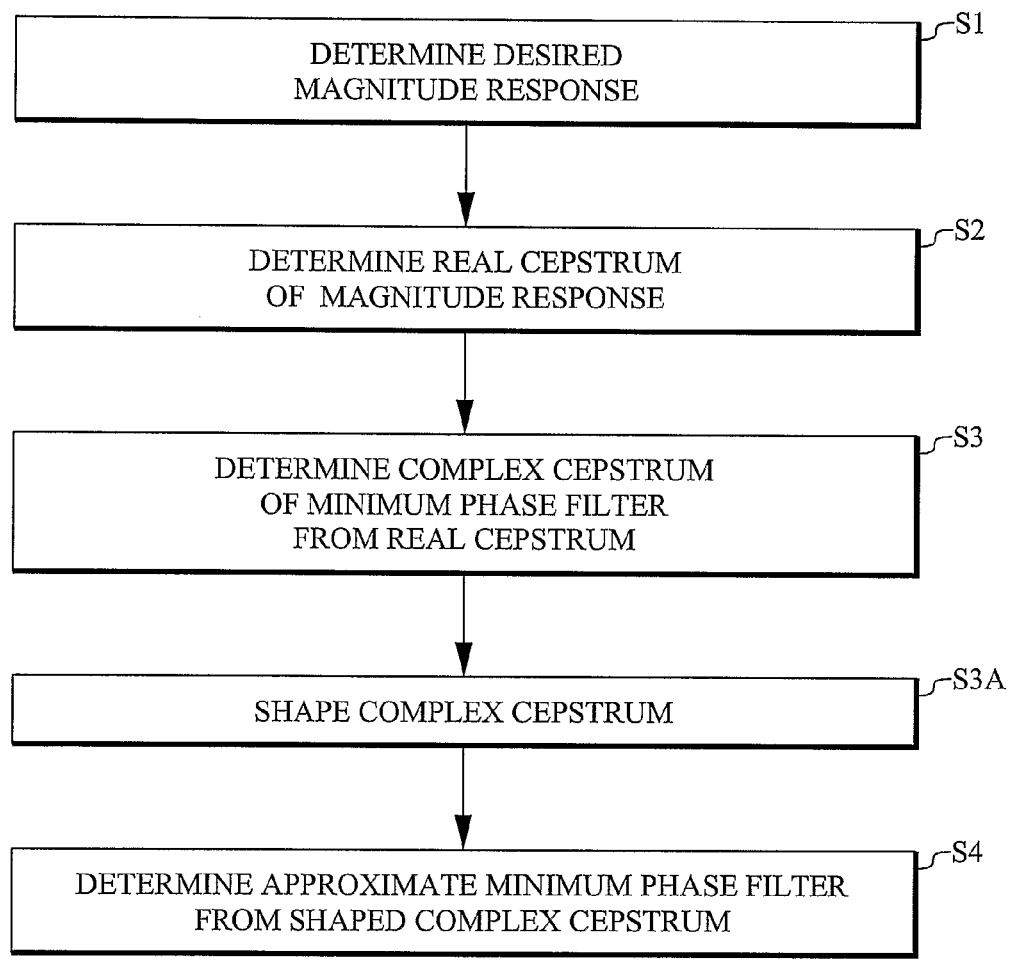
FIG. 3 is a flow chart illustrating an embodiment of the method in accordance with the present invention.

FIG. 3 is a flow chart illustrating an embodiment of the method in accordance with the present invention. Steps S1–S3 are the same as in the method in accordance with FIG. 3. However, in accordance with this embodiment of the present invention a new shaping step S3A has been inserted between steps S3 and S4. Step S3A applies a smoothly decaying window function to shape the coefficients to be included in the complex cepstrum. Thus, a window function w(n) is applied to $\hat{h}_{min}(n)$ in (23) in accordance with $$\hat{h}_{shaped}(n) = w(n)\hat{h}_{min}(n) \qquad (25)$$

In step S4 $\hat{h}_{shaped}(n)$ replaces $\hat{h}_{min}(n)$ in (24).

FIG. 4(a)-(d) is a sequence of diagrams graphically illustrating the embodiment of FIG. 3. FIG. 4(a) illustrates a hypothetical real cepstrum. In practice a real cepstrum will of course not have this form, but this hypothetical real cepstrum is very convenient for illustrating the method in accordance with the present invention. FIG. 4(b) illustrates the complex cepstrum formed from the real cepstrum in accordance with (23). FIG. 4(c) illustrates a shaping window in the form of a Kaiser window with the Kaiser window parameter β=6 (other values are of course also possible; typical values lie in the interval 1<β<10. In FIG. 4(d) the shaping window is applied to the complex cepstrum to form the shaped complex cepstrum that is forwarded to step S4 in the method of FIG. 3. Although the shaping window in this example has been applied to the complex cepstrum, it is appreciated that the window can equally well be applied directly to the real cepstrum coefficients before they are converted to complex cepstrum coefficients. Mathematically the result will be the same. Furthermore, since taps M/2+1, . . . , M−1 in the complex cepstrum are set to zero anyway to form a complex cepstrum that corresponds to a minimum-phase filter, actually only one half of the Kaiser window is required.

In the embodiment described above a Kaiser window has been used for shaping the sequence of coefficients $\hat{h}_{min}(n)$. However, other smoothly decaying window functions, such as Hamming, Hanning, Blackman, Bartlett windows, are also feasible.

Figure 5:
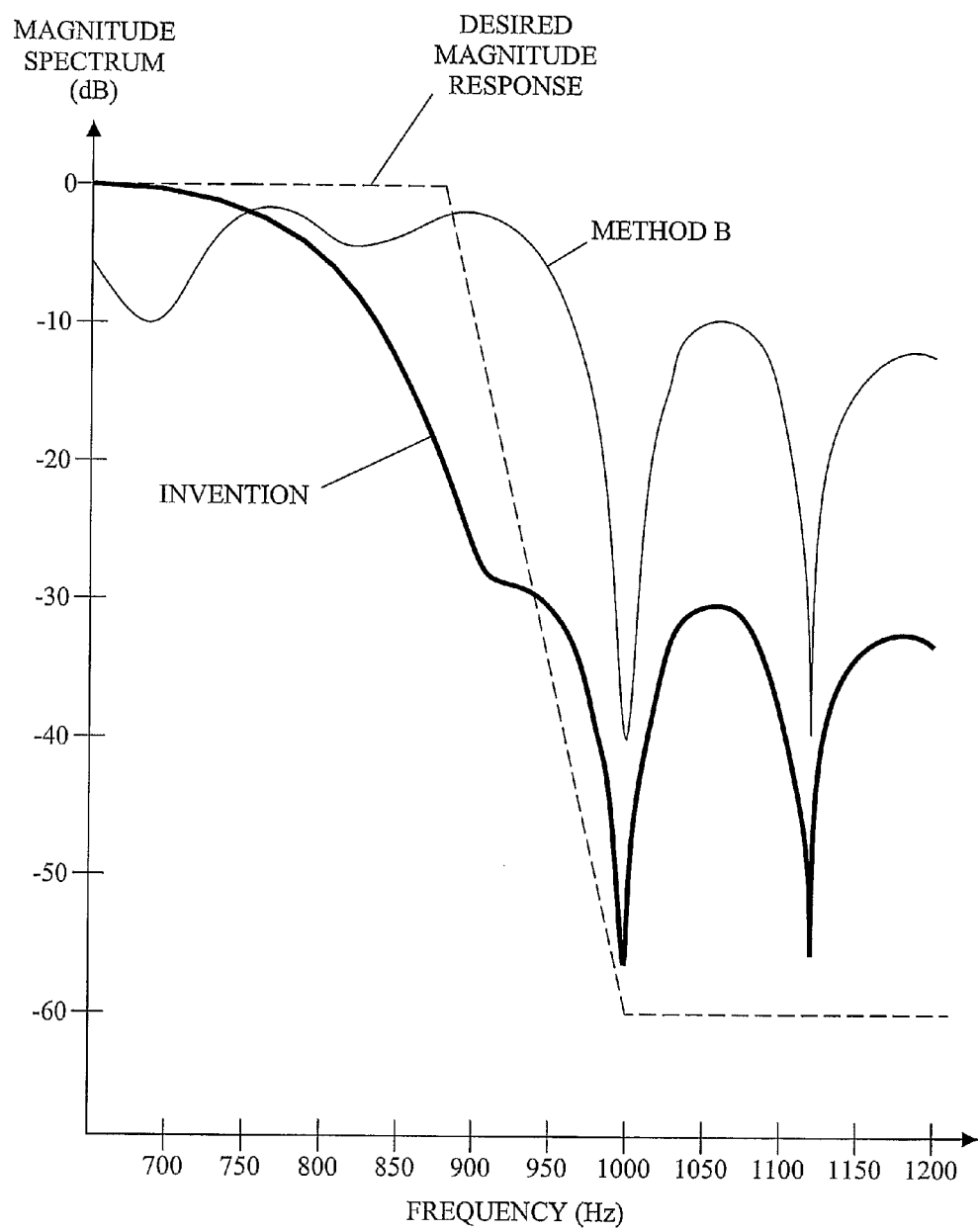
FIG. 5 is a diagram comparing the embodiment of FIG. 3 with the prior art method B.

FIG. 5 is a diagram comparing the embodiment of FIG. 3 with the prior art method B in accordance with FIG. 2. In both cases a DFT of length M=64 was used to determine an estimated minimum-phase filter corresponding to the indicated desired magnitude response. As can be seen from FIG. 5 the present invention gives a stop band rejection in the order of 30 dB even with such a short DFT. The corresponding stop band rejection for the filter obtained by method B is only in the order of 10 dB. In fact, it has been found that in order to obtain a comparable stop band rejection with method B, a DFT having a length M equal to at least 512 is required. Thus, the significantly less complex method of the present invention provides estimated minimum-phase filters with excellent stop band rejection.

From Shannon's sampling theorem it is known that replacement of the integrals in Fourier transforms by sums can be done without error if the spectrum of the signal is zero for all frequencies above half the sampling frequency. In the problem at hand, the logarithm of the system function $\hat{H}(\omega) = \ln|H(\omega)|$ must be sampled before computing the inverse Fourier transform. Hence, it should be ensured that a condition similar to that of the sampling theorem holds for $\ln|H(\omega)|$. Typically in echo cancellation and noise reduction applications, the dynamically updated desired magnitude response $H(\omega_k)$ is computed in real time for a certain set of frequency bands based on some algorithm. The desired filter may need to pass some of the frequency bands and suppress other bands, so that the desired magnitude response is piecewise constant. A piecewise constant function is, however, not limited to contain only frequency components below a certain limit. Such a function is preferably smoothed before sampling to avoid aliasing. It should also be noted that even if the desired frequency response fulfils the sampling theorem, there is a possibility that computing the logarithm may introduce some components that do not fulfil the theorem. Hence, according to a further embodiment of the present invention the desired frequency response (or its logarithm) is smoothed before computing the cepstrum. The smoothing is accomplished by low pass filtering $H(\omega_k)$. This can be done for example by applying a frequency domain Hanning window to $H(\omega_k)$.

Figure 6:
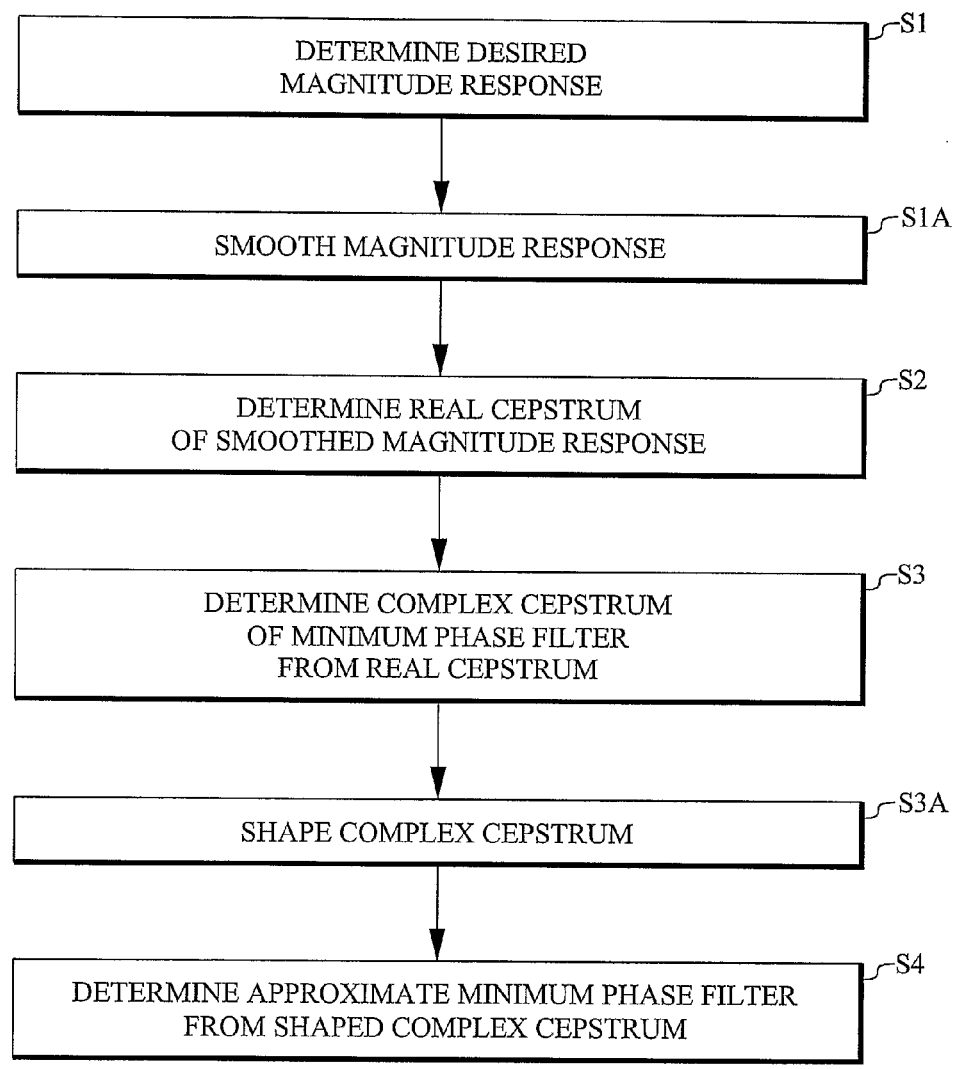
FIG. 6 is a flow chart illustrating another embodiment of the method in accordance with the present invention.

FIG. 6 is a flow chart illustrating an embodiment of the method in accordance with the present invention that includes smoothing in accordance with the previous paragraph. This method includes the same steps as the method of FIG. 3, but is supplemented by a smoothing step S1A between steps S1 and S2.

Figure 7:
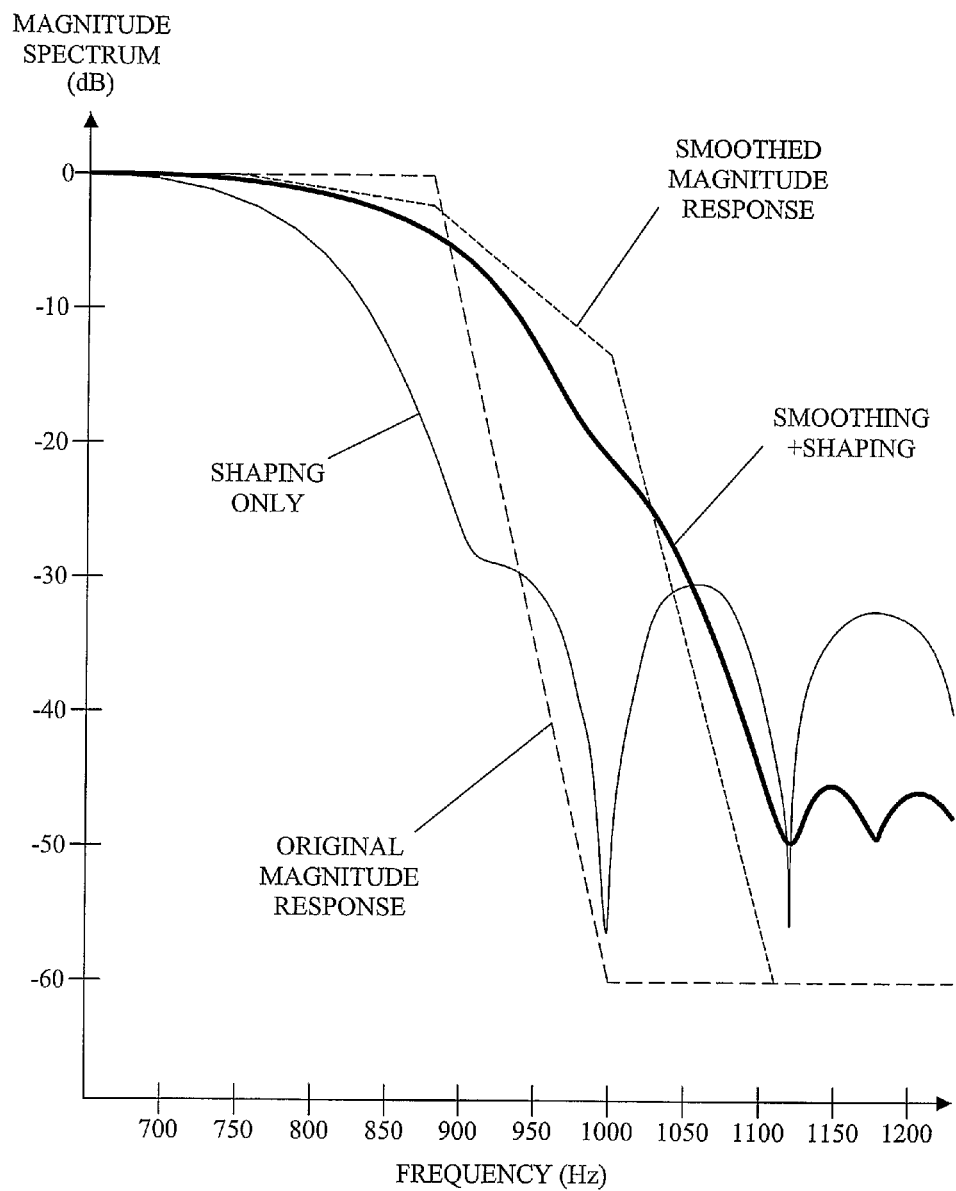
FIG. 7 is a diagram comparing the embodiment of FIG. 3 with the embodiment of FIG. 6.

FIG. 7 is a diagram comparing the embodiment of FIG. 3 with the embodiment of FIG. 6. In this example, which is based on the same DFT length (M=64), the original magnitude response of FIG. 5 has been convolved (smoothed) with a Hanning window having the symmetrical kernel (¼, ½, ¼), i.e.

$$H_{smoothed}(\omega_k) = \frac{1}{4}H(\omega_{k-1}) + \frac{1}{2}H(\omega_k) + \frac{1}{4}H(\omega_{k+1}) \quad (26)$$

As can be seen in FIG. 7 the smoothing step improves the stop band rejection by about a further 15 dB compared to the example of FIG. 5.

From FIG. 7 it is also noted that the smoothing step widens the passband of the original magnitude response. This in turn results in a widened pass band for the minimum-phase filter obtained. If the passband width is of importance, widening of the passband can be counteracted by narrowing the passband of the original magnitude response one or several bins before smoothing.

In the description above a Hanning window has been described (due to its simple kernel) for smoothing the magnitude response. However, other smoothing windows, such as Hamming, Blackman, Bartlett, Kaiser windows, are also feasible.

Figure 8:
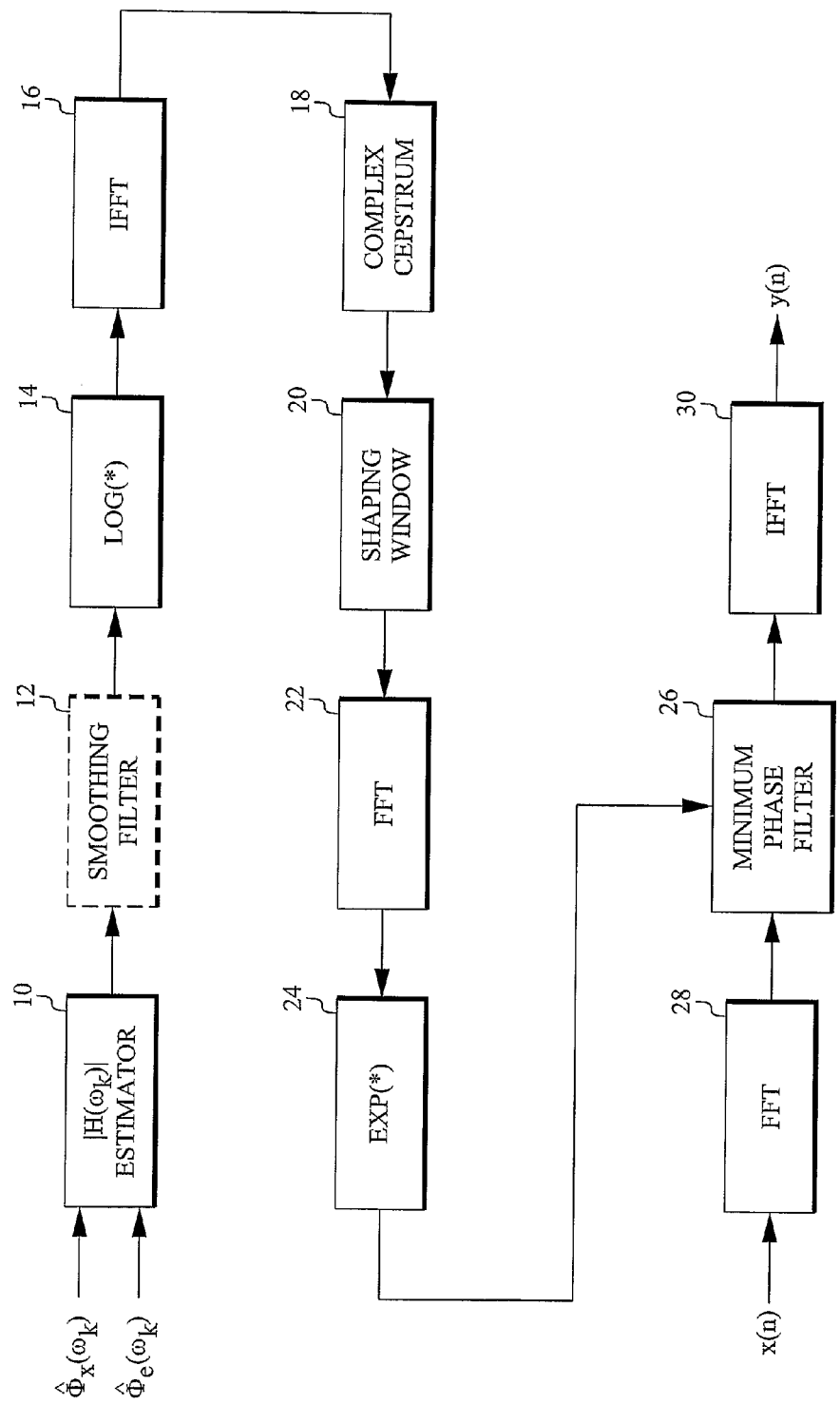
FIG. 8 is a block diagram illustrating an embodiment of an apparatus for reducing digital filter delay in accordance with the present invention.

FIG. 8 is a block diagram illustrating an embodiment of an apparatus for reducing digital filter delay in accordance with the present invention illustrated in an echo canceller environment. An estimator 10 estimates the desired filter magnitude, for example in accordance with the method described in [4]. Here $\hat{\Phi}_x(\omega_k)$ represent an estimate of the power spectral density of a signal x(n) contaminated by echo and $\hat{\Phi}_e(\omega_k)$ represents an estimate of the power spectral density of the echo signal. The determined magnitude response is passed through a smoothing filter 12 (optional, as indicated by the dashed lines), for example a Hanning filter. The (optionally) smoothed magnitude response is forwarded to a logarithm block 14, which outputs the logarithm of its input signal. A frame containing M output signal samples from block 14 is forwarded to an inverse fast Fourier transformation block 26. The output signal from block 16 forms the real cepstrum, which in block 18 is transformed into a complex cepstrum associated with a minimum-phase filter. The complex cepstrum is shaped in a shaping window 20, for example a Kaiser window. The shaped complex cepstrum is forwarded to a fast Fourier transformation block 22. The output samples of block 22 are forwarded to an exponential function block 24. The final estimate of the minimum-phase filter from block 24 is stored in a filter block 26. This filter is used to suppress the echo contained in input signal x(n). Before signal x(n) is filtered it is typically transformed to the frequency domain by a fast Fourier transformation block 28. After filtering in filter 26, the output signal y(n) is obtained from an inverse fast Fourier transformation block 30.

As an alternative, the filtering of input signal x(n) may also be performed in the time domain, provided that the minimum-phase filter from block 24 is transformed into a corresponding impulse response in an IFFT block.

The different blocks of the echo canceller of FIG. 8 are typically implemented by a micro processor or a micro/signal processor combination and corresponding software.

Although the present invention has been described in detail with reference to echo cancellation, the same principles may be used in other applications, for example noise reduction in telecommunication or audio systems. As is described in [4] this application may be based on a serially connected noise reduction filter with a desired magnitude response, the delay of which should be as small as possible. The essential difference is that instead of determining the desired magnitude response from an estimate $\hat{\Phi}_x(\omega_k)$ of the power spectral density of the input signal and an estimate $\hat{\Phi}_e(\omega_k)$ of the power spectral density of the echo signal, the desired magnitude response in noise reduction is determined from an estimate of the power spectral density of the noisy input signal and an estimate of the power spectral density of the pure noise, as described in [4]. With these changes the block diagram of FIG. 8 may be used to implement a noise suppressor.

The present invention proposes a method for design of minimum-phase filters from a magnitude frequency response (with arbitrary phase) using only short DFTs. This results in a low complexity method, which outperforms all other known methods in terms of complexity and resulting stop band attenuation of the resulting minimum-phase filters. The method is particularly suitable for environments where a multitude of identical channels have to be processed (e.g. noise reduction, echo cancelling devices) at a minimum cost of computational operations and heat dissipation. The method allows for processing of more channels simultaneously than would have been possible using state of the art methods, given a limited amount of computational power. Alternatively, the reduced complexity provided by the present invention may be used to reduce heat dissipation and/or improve battery utilization.

It will be understood by those skilled in the art that various modifications and changes may be made to the present invention without departure from the scope thereof, which is defined by the appended claims.

REFERENCES

[1] ITU-T G.131, Talker echo and its control
[2] U.S. Pat. No. 658,107 B1
[3] Kucera V., Discrete linear control, John Wiley & Sons, 1979
[4] WO 01/18960 A1
[5] A. V. Oppenheim and R. W. Schafer, Discrete-time signal processing, Prentice-Hall, Inter. Ed., 1989, Chapter 12
[6] Bysted, T. K., Aliasing in the complex cepstrum of linear-phase signals, International Conference on Information, Communication and Signal Processing, 1997

The invention claimed is:

1. A method of reducing a digital filter delay, including the steps of
    determining a first finite sequence of coefficients representing a real cepstrum of a magnitude response of a desired digital filter,
    transforming said first sequence into a second sequence of coefficients representing a corresponding complex cepstrum,
    determining an estimate of a minimum-phase digital filter corresponding to said second sequence, where said transforming step includes shaping of coefficients to be included in said second sequence by applying a smoothly decaying window function.

2. The method of claim 1, wherein said shaping of coefficients is performed with a Kaiser window.

3. The method of claim 1, comprising smoothing said magnitude response before determining said first sequence.

4. The method of claim 3, wherein said smoothing is performed with a Hanning window.

5. An apparatus for reducing a digital filter delay, wherein said apparatus is configured to perform the following:
    determine a first finite sequence of coefficients representing a real cepstrum of a magnitude response of a desired digital filter,
    transform said first sequence into a second sequence of coefficients representing a corresponding complex cepstrum, and
    determine an estimate of a minimum-phase digital filter corresponding to said second sequence, where said apparatus is configured to transform said first sequence by applying a smoothly decaying window function to shape coefficients to be included in said second sequence.

6. The apparatus of claim 5, wherein said smoothly decaying window function is a Kaiser window.

7. The apparatus of claim 5, comprising a filter for smoothing said magnitude response before determining said first sequence.

8. The apparatus of claim 7, wherein said filter is a Hanning window.

9. An echo canceller for a telecommunication system, including a non-linear processor with a serially connected echo canceling digital filter, wherein said echo canceller comprises:
    an apparatus for reducing the delay of said filter, wherein said apparatus is configured to perform the following:
    determine a first finite sequence of coefficients representing a real cepstrum of a magnitude response of a desired digital filter,
    transform said first sequence into a second sequence of coefficients representing a corresponding complex cepstrum, and
    determine an estimate of a minimum-phase digital filter corresponding to said second sequence, where said apparatus is configured to transform said first sequence by applying a smoothly decaying window function to shape coefficients to be included in said second sequence.

10. A noise suppressor including a serially connected noise suppressing digital filter, said noise suppressor comprising:
    an apparatus for reducing the delay of said filter, wherein said apparatus is configured to perform the following:
    determine a first finite sequence of coefficients representing a real cepstrum of a magnitude response of a desired digital filter,
    transform said first sequence into a second sequence of coefficients representing a corresponding complex cepstrum, and
    determine an estimate of a minimum-phase digital filter corresponding to said second sequence, where said apparatus is configured to transform said first sequence by applying a smoothly decaying window function to shape coefficients to be included in said second sequence.

* * * * *

UNITED STATES PATENT AND TRADEMARK OFFICE
CERTIFICATE OF CORRECTION

PATENT NO. : 8,078,659 B2
APPLICATION NO. : 12/092013
DATED : December 13, 2011
INVENTOR(S) : Lusk et al.

It is certified that error appears in the above-identified patent and that said Letters Patent is hereby corrected as shown below:

In Column 5, Lines 32-34, in Equation (17), delete "$\begin{matrix} 2 \cdot \hat{h}(n), & n > 0 \\ \hat{h}_{min}(n), & n = 0 \\ & n < 0 \end{matrix}$" and insert --$\begin{matrix} 2 \cdot \hat{h}(n), & n > 0 \\ \hat{h}(n), & n = 0 \\ 0 & n < 0 \end{matrix}$--, therefor.

Signed and Sealed this
Twentieth Day of March, 2012

David J. Kappos
*Director of the United States Patent and Trademark Office*